United States Patent
Heyl et al.

(10) Patent No.: US 7,358,884 B1
(45) Date of Patent: Apr. 15, 2008

(54) METHODS AND SYSTEMS FOR IMPLEMENTING A DIGITAL-TO-ANALOG CONVERTER

(75) Inventors: Lawrence Frederick Heyl, Colchester, VT (US); David Tupman, San Francisco, CA (US); Brian A. Childers, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 11/544,489

(22) Filed: Oct. 5, 2006

(51) Int. Cl.
*H03M 1/66* (2006.01)

(52) U.S. Cl. .................. 341/144; 341/61; 341/143; 341/152

(58) Field of Classification Search .............. 341/144
See application file for complete search history.

(56) References Cited

U.S. PATENT DOCUMENTS

| | | | | |
|---|---|---|---|---|
| 5,644,310 | A * | 7/1997 | Laczko et al. | 341/143 |
| 6,011,501 | A * | 1/2000 | Gong et al. | 341/150 |
| 6,340,940 | B1 * | 1/2002 | Melanson | 341/143 |
| 2004/0189502 | A1 * | 9/2004 | Lee | 341/152 |
| 2005/0110667 | A1 * | 5/2005 | Borisavljevic | 341/152 |

* cited by examiner

*Primary Examiner*—Khai M. Nguyen
(74) *Attorney, Agent, or Firm*—IP Strategy Group, P.C.

(57) ABSTRACT

A self-contained DAC that is especially suitable for use as an IP core, particularly for SOC (System on Chip) implementation. Techniques are applied to employ certain circuits (such as arithmetic element 302) to perform multiple functions in the DAC, thereby resulting in space saving. Techniques are also applied to employ fewer circuits per functional block to achieve further space saving. By employing multiple clock domains and turning on selective circuits on an as-needed basis, power saving is also realized.

31 Claims, 12 Drawing Sheets

METHODS AND SYSTEMS FOR IMPLEMENTING A DIGITAL-TO-ANALOG CONVERTER

BACKGROUND OF THE INVENTION

A Digital-to-Analog Converter (DAC) represents a circuit employed to generate an analog signal from its binary, digital representation. Simplistically speaking, if the input of a DAC is coupled to appropriate computational circuitry and output is coupled to an appropriate transducer arrangement, a digital audio system is created.

Modern electronic devices tend to be much more sophisticated. For example, most desktop or laptop computers and even portable entertainment devices such as the iPod™, available from Apple Computer, Inc. of Cupertino, Calif., can generate high fidelity audio from stored or streamed digital data using highly sophisticated DACs.

With respect to portable devices, for example, there is a premium on devices that can generate the highest quality sound using the lowest amount of power and/or the smallest form factor. Accordingly, manufacturers constantly try to improve DAC designs, striving to improve the output quality and reducing the power requirement and/or the size of the DAC or the size of the audio circuitry of which the DAC plays an indispensable role.

The present application pertains to an improved DAC architecture that can be employed to generate high fidelity audio output with minimal power requirement and/or minimal footprint.

SUMMARY OF INVENTION

The invention relates, in an embodiment, to a digital-to-analog converter (DAC) circuit for converting digital input data to analog data. The DAC circuit includes an input host interface circuit configured to receive the digital input data. The DAC circuit further includes an interpolator circuit configured to interpolate at least a portion of the digital input data received by the input host interface circuit and to generate interpolated data, wherein the interpolator circuit is implemented with multiple interpolator stages sharing an arithmetic unit for computing the interpolated data.

In another embodiment, the invention relates to a digital-to-analog converter (DAC) circuit for converting digital input data to analog data. The DAC circuit includes an input host interface circuit configured to receive the digital input data and an interpolator circuit. The DAC circuit also includes a volume control circuit coupled to the interpolator circuit, the interpolator circuit and the volume control circuit being configured to receive the digital input data and to output volume-weighted and interpolated data. The DAC circuit additionally includes a noise shaper circuit coupled to receive the volume-weighted and interpolated data to generate reduced-width shaper output. The DAC circuit further includes a transition generator circuit configured to generate a transition signal. The DAC circuit also includes a pulse width modulator circuit configured to receive the reduced-width shaper output and to produce a first pulse code modulation signal from the reduced width shaper output when the DAC is operating in a first state. The pulse width modulator circuit is configured to receive the transition signal to produce a second pulse code modulation signal from the transition signal when the DAC is operating in a second state. The second state is characteristic of at least one of a power-up condition and a power-down condition. The first state is characteristic of operating conditions other than the at least one of the power-up condition and the power-down condition.

In another embodiment, the invention relates to a digital-to-analog converter (DAC) circuit for converting digital input data to analog data. The DAC circuit includes an input host interface circuit configured to receive the digital input data. The DAC circuit also includes an interpolator circuit configured to interpolate at least a portion of the digital input data that is received by the input host interface circuit and to generate interpolated data. The DAC circuit additionally includes a volume control circuit configured to generate volume-weighted data from the interpolated data. The DAC circuit also includes a noise shaper circuit for reducing the word width of the volume-weighted data to generate reduced-width shaper output.

In yet another embodiment, the invention relates to a digital-to-analog converter (DAC) circuit for converting digital input data to analog data. The DAC circuit includes an input host interface circuit configured to receive the digital input data. The DAC circuit also includes an interpolator circuit and a volume control circuit coupled to the interpolator circuit. The interpolator circuit and the volume control circuit are configured to receive the digital input data from the input host interface circuit and to output volume-weighted and interpolated data. The DAC circuit also includes a noise shaper circuit coupled to receive the volume-weighted and interpolated data to generate reduced-width shaper output. The DAC circuit further includes a pulse width modulator circuit configured to receive the reduced-width shaper output and to produce a first pulse code modulation signal from the reduced width shaper output. The DAC circuit additionally includes an analog output circuit including an output buffer and a low-pass filter for receiving the first pulse code modulation signal and outputting the analog data, wherein the input host interface circuit employs a first clock associated with a first clock domain, the interpolator circuit, the volume control circuit, and the noise shaper circuit, and at least a portion of the pulse width modulation circuit employ a second clock associated with a second clock domain, the second clock being asynchronous relative to the first clock.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
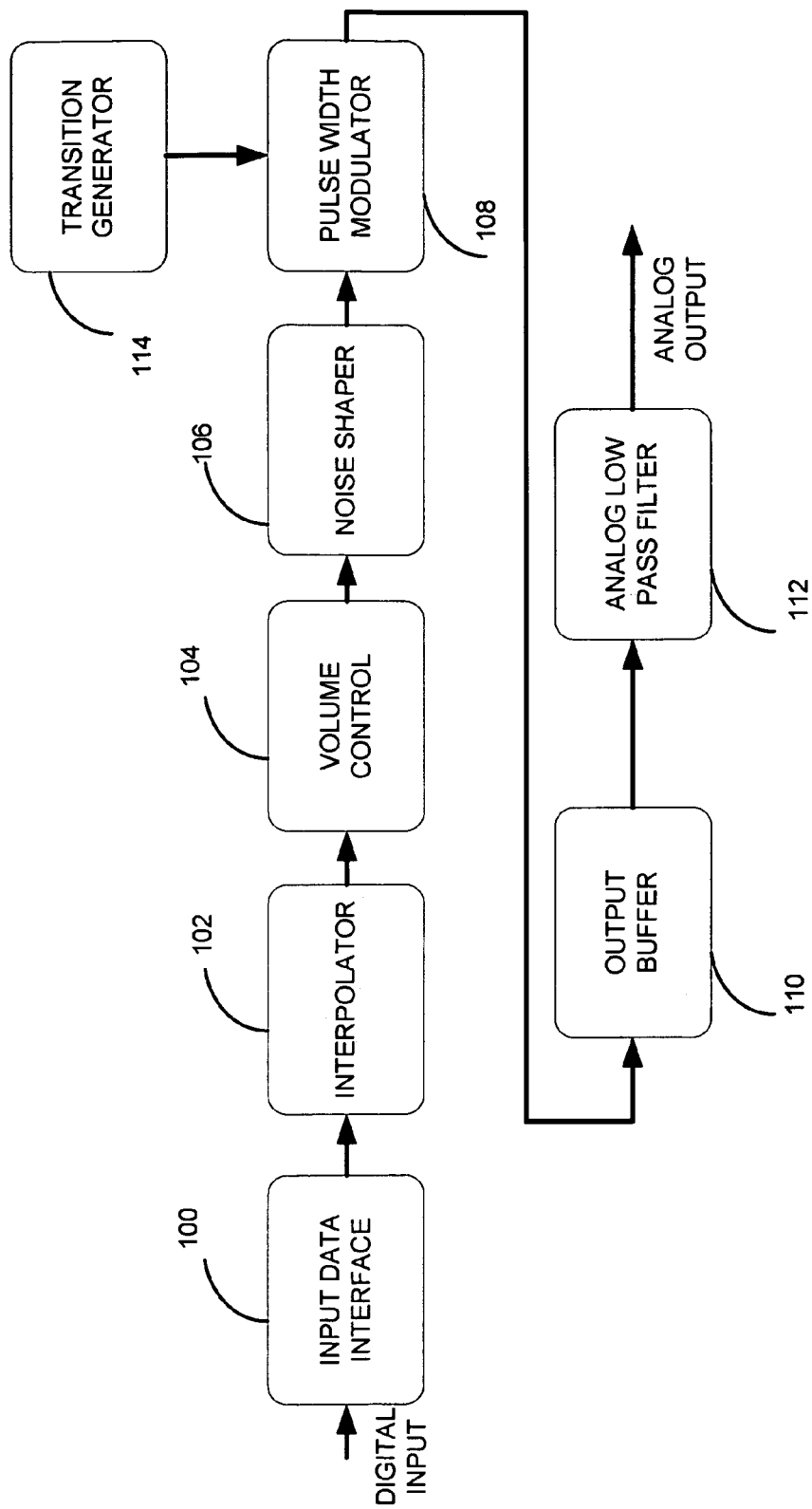
FIG. 1 shows, in accordance with an embodiment of the invention, the high-level logic block diagram architecture of the inventive DAC.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, there is provided an improved DAC architecture that is well-suited for being implemented as an "IP core." That is, the DAC architecture disclosed in accordance with embodiments of the present invention can be readily integrated as part of an integrated circuit on which other components of an electronic device (such as the aforementioned iPOD™) can be implemented as well. By designing the inventive DAC to be an IP core, the inventive DAC can be readily reused in different System-on-Chip (SOC) integrated circuits to implement different digital audio devices.

As the term is employed herein, a digital audio device represents an electronic device or component configured to generate or contribute to the generation of audible sound signals from digital data (which includes, for example, streamed digital data, stored digital data, or generated digital data). The digital audio devices thus encompasses not only computing devices (such as desktop or laptop computers) but also entertainment devices (such as for example music players or video players) or components thereof that are configured to generate or contribute to the generation of audible sound signals from digital signals. Further, the digital audio devices may take any form factor, including for example devices configured to operate only when plugged into the power mains or portable devices configured to operate off a battery.

In an embodiment, the inventive DAC represents an oversampling DAC that is implemented using seven functional blocks. These are an input interface, an interpolator, a volume control, a noise shaper, a pulse width modulator, an output buffer, and an analog low pass filter. Innovations were made to many of these functional blocks to advance the overall goal of a low-power, high-fidelity DAC IP core.

In an embodiment, a special purpose functional block known as a transition generator is provided to improve the quality of the audio output by addressing the need to change the circuit element from a state of no power to one in which power is applied in a fashion to cause equilibration without audible artifacts. The transition generator substantially reduces or eliminates the audible "pop" that is sometimes heard due to the aforementioned transient response. The transition generator will be discussed in details later herein.

In an embodiment, separate clock domains are provided such that different functional blocks can operate at different speeds based on different clocks. For example, certain blocks such as the output buffer may operate at a certain rate to output the desired musical sound. While the output block works at a given speed to output the expected musical tune, other computational blocks may be operating at much higher speed and may thus be able to compute and buffer data in advance. With a sufficient buffer, it is possible to turn off the computational blocks to save power. As the buffer empties, the computational blocks may be turned on again to compute and buffer additional data. Details pertaining to the separate clock domains will be furnished later herein.

As discussed earlier, in embodiments of the invention, the inventive DAC is implemented using seven functional blocks. In the following disclosure, each of these blocks will be discussed in turn. FIG. 1 shows, in accordance with an embodiment of the invention, the high-level logic block diagram architecture of the inventive DAC. With respect to FIG. 1, each of the major functional blocks will be discussed briefly first. In subsequent figures, the functional blocks that comprise the inventive DAC of FIG. 1 will be discussed in details.

As can be seen in FIG. 1, there is shown an input data block 100 that receives and buffer data to be used by an interpolator block interpolator block 102 that is configured to interpolate the input data stream as needed by downstream processing. The output of interpolator block 102 is applied to a volume control block 104. Volume control block 104 receives the interpolated data from interpolator block 102 and, in an embodiment, multiplies the interpolated data by a volume control word to adjust the volume to the level set by the user. Volume control block 104 then outputs the resultant word to noise shaper block 106, which is the primary component to reduce the word width needed for digital to analog conversion.

Pulse Width Modulator block 108 receives the reduced width word from noise shaper block 106 to generate a 1-bit output for digital to analog conversion using pulse width modulation. Output buffer 110 and Analog Low Pass Filter 112 accomplishes the digital-to-analog conversion using the output from pulse width modulation block 108.

As mentioned, a transition generator block 114 is provided to eliminate audible artifacts that are generated from the transient response of the analog output network that comprise output buffer 110 and analog low pass filter 112 when power is first applied or finally removed. In an embodiment, transition generator 114 applies a raised cosine taper to the pulse width modulator. Transition generator block 114 will be discussed later herein in connection with FIGS. 8A and 8B.

Generally speaking, the data applied to the DAC via the input data interface can be in many forms. In an example implementation, the input data is 16-bit per channel stereo audio sampled at 44.1 kHz. In other implementations, different numbers of bits per channel and/or different sampling rates may be employed. The actual data transfers into the DAC are performed on a demand basis when signaled by the downstream processing. The input data interface receives and buffers data to be converted for use by the interpolator.

Figure 2:
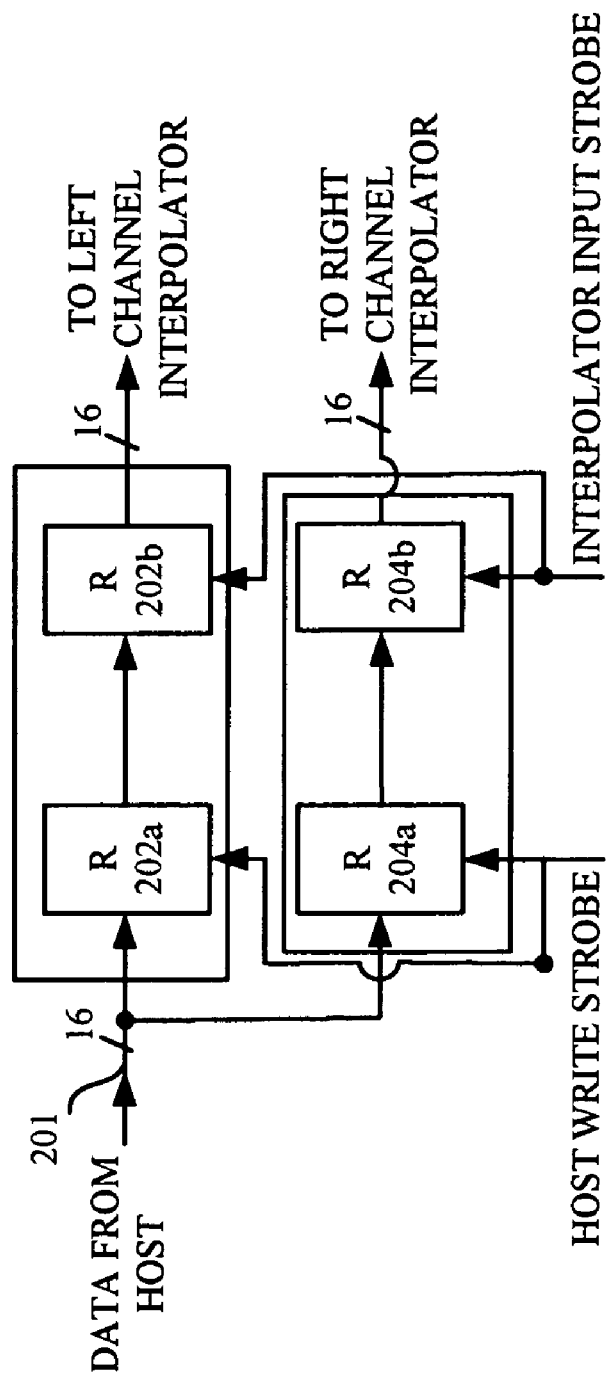
FIG. 2 shows an input data interface typical of those employed in the art.

FIG. 2 shows an input data interface typical of those employed in the art. As shown in FIG. 2, data from host (e.g., data stream representing music from stored memory) is received by two sets of registers 202 and 204, representing the sets of registers for the left channel interpolator and the right channel interpolator respectively. Register set 202 for the left channel interpolator includes a register 202*a*, which is clocked by the host write strobe signal, and a register 202*b*, which is clocked by an interpolator input strobe from interpolator block 102. The host write strobe causes register 202*a* to capture the data presented on bus 201, and the interpolator input strobe causes the data from register 202*a* to be transferred to output 203 to be provided to the left channel interpolator. Likewise, register set 204 for the right channel interpolator includes a register 204*a*, which is clocked by the host write strobe signal, and a register 204*b*, which is clocked by an interpolator input strobe from interpolator block 102.

It should be kept in mind that although the example herein discusses the explicit demultiplexing into left and right channels at this stage, it is also possible to process the left channel samples and the right channel samples sequentially by accounting for the left channel data and the right channel data in the intermediate results in the various stages (e.g., the interpolation stage, the digital filter in the noise shaper, the noise-shaped PCM output of the noise shaper, etc.). In an embodiment, the amount of storage in the intermediate stages may be increased and registers may be assigned to left channel data and right channel data (e.g., odd numbered registers for left channel data and even numbered registers for right channel data or some analogous schemes) so that one clock phase may be employed to operate on the left channel data and another clock phase may be employed to operate on the right channel data. The transition to the output clock domain would allow reclocking the left channel data and the right channel data to be coincident in time for D/A conversion, so the operation would be essentially invisible to the DAC performance.

Generally speaking, a reduced word width is employed for digital to analog conversion. A component step in generating such a reduced word width is to interpolate the input data stream as needed by the downstream processing. The interpolator represents the component for performing this function.

Prior art has generally suggested the design of interpolators with stopband gain sufficient to attenuate the sampling images in the interpolated signal to the level of the quantization noise floor of the channel. This constraint requires significant computation to achieve. One representative design uses a cascade of three FIR filters with lengths of 125, 25, and 5 taps.

The inventors herein realize that a sufficient condition for successful operation of the interpolator is to attenuate the sampling images such that the total energy of the baseband signal and its attenuated images is less than the amplitude that would drive the downstream noise shaper into an overloaded state. Lifting the constraint in the prior art allows a significant reduction in the complexity of the interpolator and hence its power requirements. In comparison to the prior art, an embodiment of the interpolator requires an FIR cascade of lengths 47, 7, and 3 taps. The inventive FIR filters achieve further efficiency by constraining them to be half band, that is, all even samples of the kernel equal zero, and the filter is an even function. It is typical to design half band filters by the window method, but in embodiments of the invention, a simple modification to the Remez exchange technique is employed to allow design of half band filters with optimal Chebyshev error. This technique was first disclosed by Mintzer. See F. Mintzer, "On Half-Band, Third-Band, and Nth-Band FIR Filters and Their Design", IEEE trans. Acoustics, Speech, and Signal Processing, vol. ASSP-30, No. 5, October 1982, pp. 734-8.

As is well known in the art, when the interpolated signal has been increased in sampling rate sufficiently, it is possible to employ a zero order hold to effect sampling rate increases with only a holding register, which can often be implicit between operations.

In one example implementation, one arithmetic element and two memories are employed to implement the interpolator. This particular implementation will be discussed in greater detail in connection with FIG. 3 herein below. In this implementation, one memory is random access (RAM), while the second is read only (ROM). The ROM contains a microprogram of the fixed filter kernel data and a 3-bit control field (although the number of bits in the control field may vary depending on implementations). When the program counter changes value, a specific instruction in the provided set of microprograms would be executed. To save power, the arithmetic element can perform a number of computations and stores them in a queue to be worked off by downstream stages then idles in a power down state until the downstream stage requires more data.

Data path feedback allows the movement of the result of one stage of the interpolation to the next stage in RAM. The half band nature of the filters allows for further economy in computation by avoiding multiplications by zero and taking advantage of the filter even symmetry. Interpolator logic makes use of the isolated clock domain architecture as will be described later herein to achieve further economy and reduce power requirements.

Figure 3:
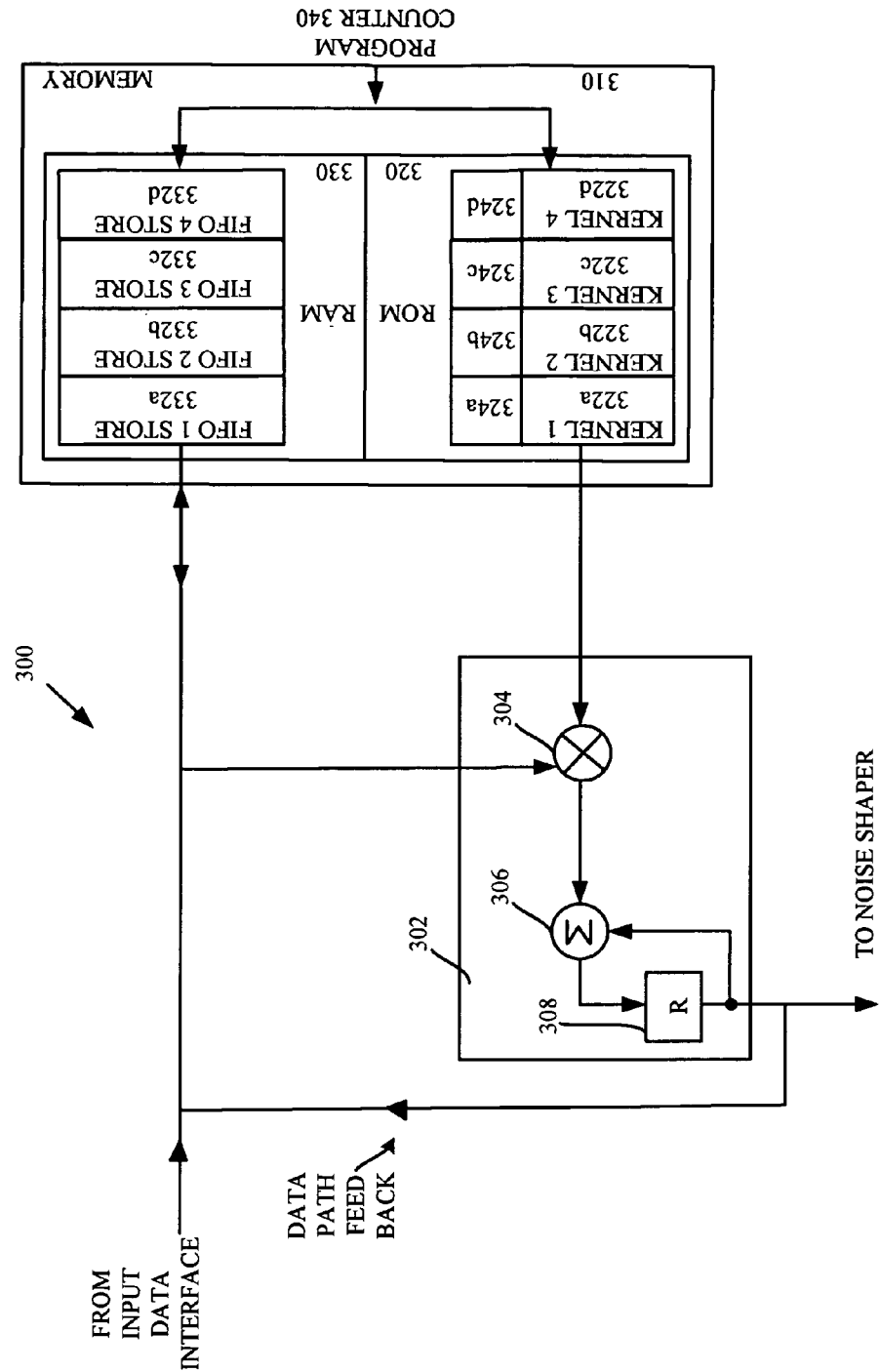
FIG. 3 shows, in accordance with an embodiment of the invention, an interpolator block.

FIG. 3 shows, in accordance with an embodiment of the invention, an interpolator block 300. Arithmetic element 302 is shown having a multiplier 304, an adder 306, and an accumulating register 308. Memory 310 includes a ROM memory block 320 and a RAM memory block 330. ROM memory block 320 stores a plurality of microprograms 322*a*, 322*b*, 322*c*, 322*d* (the exact number of which may be variable depending on how many interpolator stages is desired). Each of microprograms 322*a*, 322*b*, 322*c*, and 322*d* has an associated control field 324*a*, 324*b*, 324*c*, and 324*d* as shown.

RAM memory block 330 stores a plurality of data portions 332*a*, 332*b*, 332*c*, 332*d*, each of which is associated with a corresponding microprogram 322a-322d. Data portions 332a-332d are structured in a FIFO manner such that the first data portion stored is the first data portion popped. A program counter determines which of microprograms 322a-322d (and thus which of data portions 332a-332d) would be employed by arithmetic element 302. Each of microprograms 322a-322d and its associated data portion (i.e., one of data portions 332a-332d) implement an interpolator stage.

Within the interpolator in the example of FIG. 3, data may flow from the input data interface block 100 into one of FIFO data portions 332a-332d in RAM memory block 330, from one of FIFO data portions 332a-332d to multiplier 304 of arithmetic element 302, from accumulating register 308 back into adder 306, or from accumulating register 308 to the next FIFO data portion that is associated with the next interpolator stage in RAM memory block 330. Data in the form of microprogram code from one of microprograms 322a-322d is also provided from ROM memory block 320 to multiplier 304. The flow of data is controlled by control logic coupled to RAM memory block 330, ROM memory block 320, and arithmetic unit 302.

As discussed, program counter 340 selects which of microprograms 322a-322d and the associated FIFO data portion is employed. Each of microprograms 322a-322d has an associated control field, which may represent for example a 3-bit control field. When the data counter values matches the control field values of a particular microprogram, that microprogram (and associated FIFO data block) is employed. The control field values associated with the microprograms may be predefined values that permit precise control of interpolator stage sequencing. Generally speaking, the code in each microprogram and the associated control field value are provided in ROM at the factory or upon configuration setup to control the operation of the interpolator stages. The program counter value is also employed by the control logic to determine how data is moved among RAM memory block 330, ROM memory block 320, and arithmetic unit 302.

Accumulating register 308 accumulates the product provided by multiplier 304 (which operates on the delayed input data in one of the FIFOs using one of the microprograms) and accumulates with the previous result in adder 306. Once accumulated, the result is stored in register 308, which is either fed back to adder 306 when required by the next stage or outputted to noise shaper block 106 via data path 350.

As can be appreciated from the foregoing, the interpolator block does not require multiple cascading interpolator stages with multiple arithmetic units. The use of a single arithmetic unit instead of multiple arithmetic units advantageously reduces the amount of space required to implement the interpolator.

Generally speaking, a typical component of an audio DAC is an independently adjustable volume control, so the user can set the sound level to their liking. Prior art typically places the volume control at the input of the interpolator. It is realized by the inventors, however, that a reduction in logic and power may be achieved by placing the volume control between the interpolator output and the noise shaper input. This way, the typically 16 bit input data is carried through the interpolator with 17 bits of precision. The volume control requires additional bits in order to prevent excessive additional noise and distortion of the signal. A reasonable choice for a volume control range is 30 dB, which requires 5 additional bits in the data path. This implementation represents a modest but finite savings in logic and power.

Implementation of the volume control requires that the interpolated data be multiplied by a volume control word. Rather than use an explicit extra multiplication to achieve this, an embodiment of the invention uses a table of ROM values for the last interpolator stage. Since this is a simple three tap FIR filter with kernel values $\{1, 2, 1\}$, it is easy to build a table with values weighted by the desired volume control taper. The output from the last interpolator stage is then a 21 bit word rather than a 17 bit word as from the previous stages. This scheme reduces logic and power, offset by the minor penalty of a ROM table.

The volume control taper can be an arbitrary function. In an embodiment a logarithmic taper in accord with psychoacoustic literature stating the commonplace logarithmic perception of loudness is employed. Another candidate for a taper would be the raised cosine, $0.5[1+\cos(\arg)]$, which has desirable spectral characteristics. Other candidates are also possible.

The volume control employs zero crossing detection to update the pointer to the ROM values used in the computation. As is well known in the art, changing the level of a digital audio signal in an arbitrary manner can easily generate a step discontinuity which will be heard as a 'click'. In an implementation, the host posts a request to update the ROM pointer. With a request pending, two things occur. First, a time out counter is started, and second, a threshold detector looks at the filter output to determine if the absolute value of the signal has decreased to within an interval around zero. When the signal falls inside the detection window, the ROM pointer is updated, affecting the volume change. If the signal does not fall into the detection threshold window when the time out counter reaches its terminal count, the terminal count forces the volume update. This precludes the user sensing an undesirable lag between their request to change the volume and the volume actually changing. The detection window and time out period may be selected over a wide range. Representative values are amplitudes on $[-FS/1024, FS/1024]$ and 4096 samples.

Finally, in an example interpolator cascade four stages of filters, of lengths 47, 7, 3, and 3 taps are employed. The fourth stage could have been a zero order hold as described above. In an implementation, a three tap filter is employed in order to implement the volume control scheme. It is also possible to achieve further simplification of the volume control by making direct use of the simple three tap filter kernel values of $\{1, 2, 1\}$. That is, it is possible to allow the host to write a volume control word (VCW) to a holding register, and then perform an hardware left shift by one to realize a set of kernel values $\{VCW, 2*VCW, VCW\}$. Within the output word width, this would allow use of an arbitrary volume taper.

In addition, the volume taper could be generated algorithmically in hardware instead of in host software as is subsumed here. Either method will achieve the end of providing a flexible and inexpensive means to control and update volume tapers.

Figure 4A:
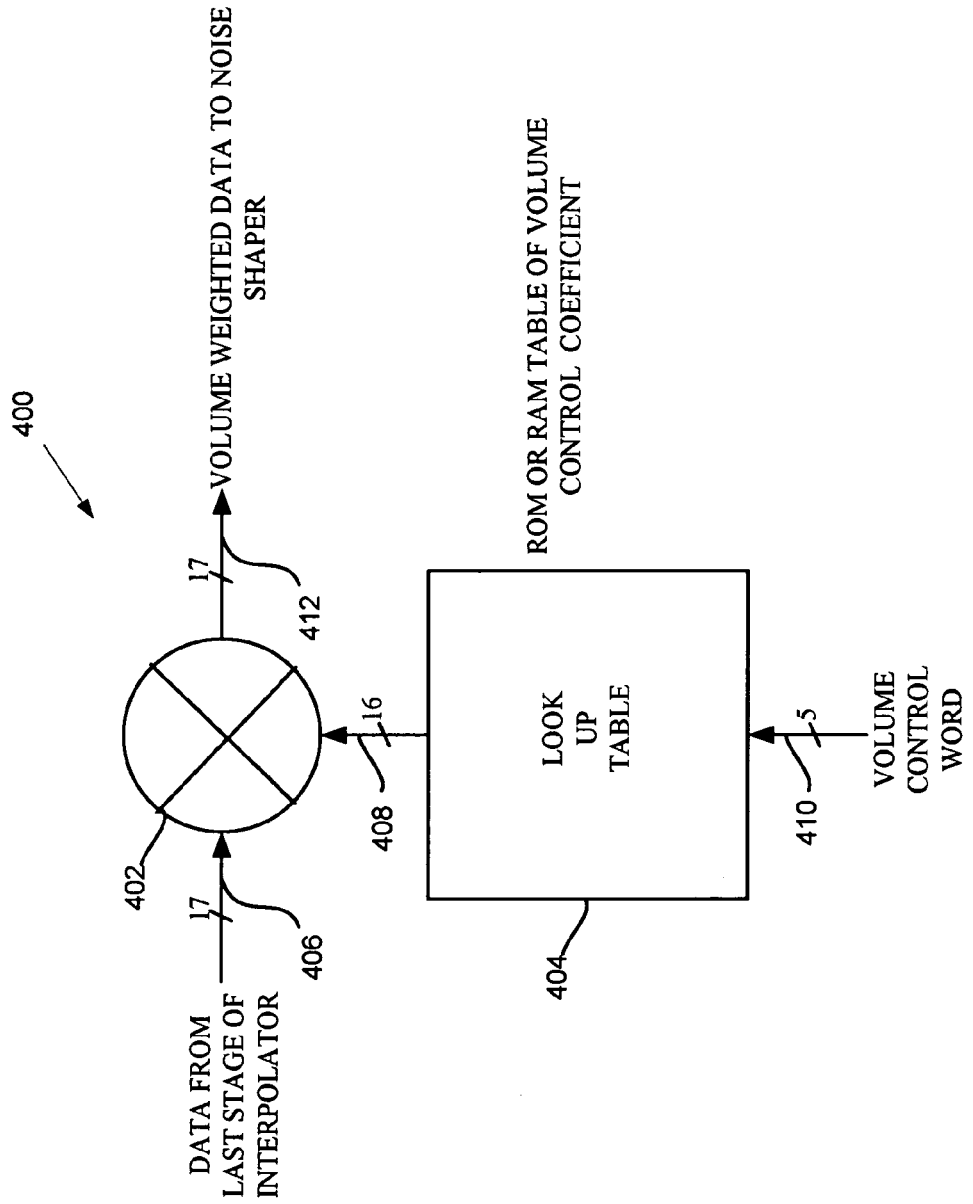
FIG. 4A shows, in accordance with an embodiment of the invention, an implementation of the volume control function wherein a multiplier and a lookup table are employed.
Figure 4B:
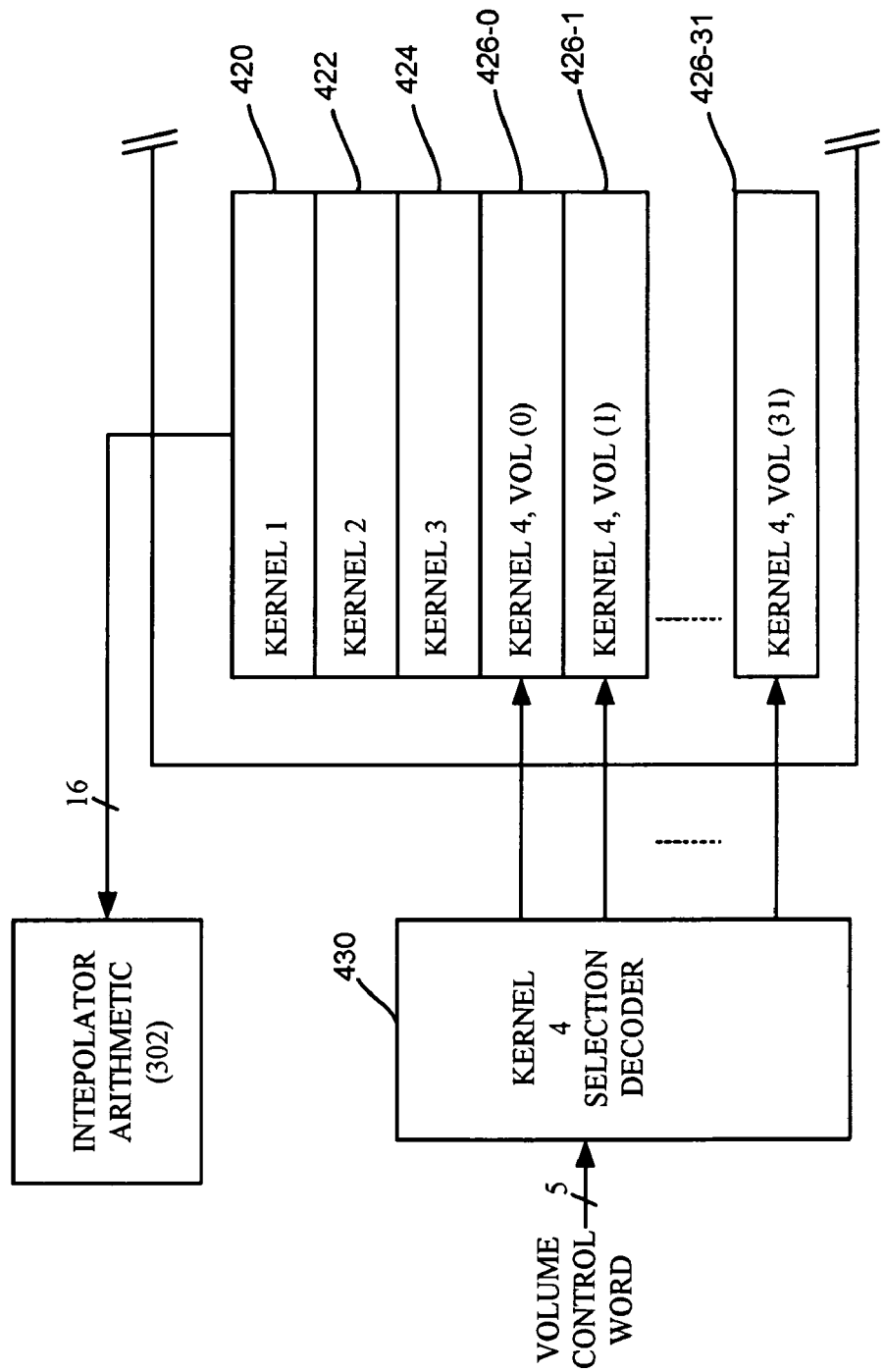
FIG. 4B shows, in accordance with an embodiment of the invention, another implementation wherein the multiplier in the arithmetic unit is employed implement the volume control function.
Figure 4C:
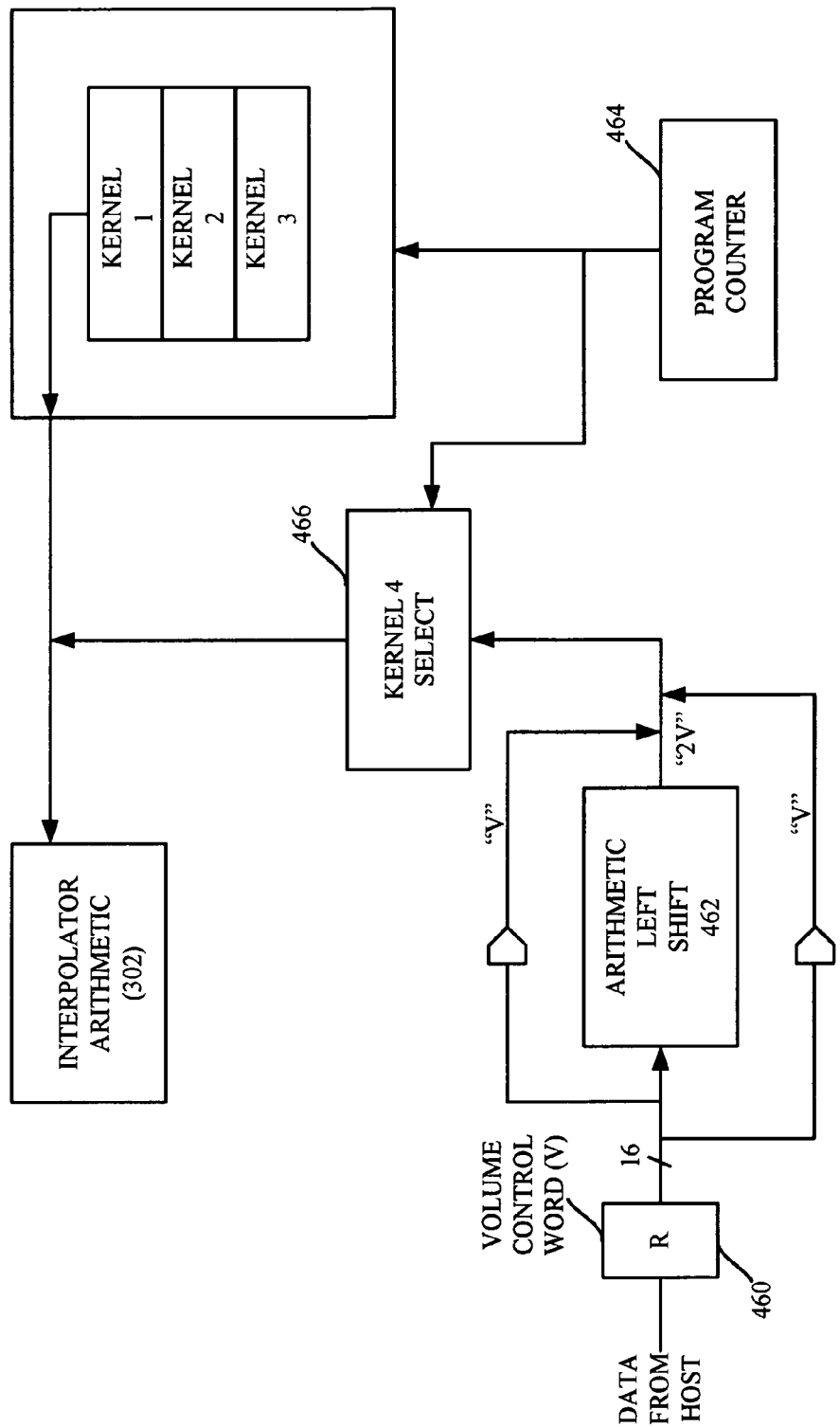
FIG. 4C shows, in accordance with an embodiment of the invention, another implementation of the volume control function by making direct use of the simple three tap filter kernel values of {1, 2, 1}.

FIGS. 4A-4C show, in accordance with an embodiment of the invention, various embodiments of volume control block 104. FIG. 4A shows an implementation 400 wherein a multiplier 402 and a lookup table 404 are employed. Lookup table 404 represents a table of volume control coefficients and may be implemented in RAM or ROM. Data 406 from the last stage of the interpolator is multiplied with a value (408) that is obtained from lookup table 404 using the volume control word value (410). The output (412) represents volume weighted data to be provided to the noise shaper block.

FIG. 4B shows another implementation wherein the multiplier in the arithmetic unit (such as multiplier 304 of arithmetic 302 of FIG. 3) is employed in order to implement the volume control function. By using an existing multiplier instead of requiring a separate multiplier, the embodiment of FIG. 4B advantageously requires less space to implement. In this case, the 3 filter kernels 420, 422, and 424 (having tap lengths of 47, 7, and 3 in an example) implement the interpolator function. The fourth filter kernel has 3 tap filter kernel values of {1, 2, 1} is set up as a table with 32 kernel values (shown as 426-0 to 426-31) to accommodate the 5-bit volume control word applied to a selection decoder 430. The volume control word selects which of 32 kernel values 426-0 to 426-31 would be employed to implement the volume control function. These kernel filter values may be stored in ROM memory block 320 of FIG. 3, for example.

FIG. 4C shows another implementation of the volume control function by making direct use of the simple three tap filter kernel values of {1, 2, 1}. In this implementation, the host writes a volume control word (VCW) to a holding register (460), and then perform an hardware left shift by one (using arithmetic shift unit 462) to realize a set of kernel values {VCW, 2*VCW, VCW}. Program counter 464 then selects (via selection block 4646) the kernel value to be employed for use to implement the volume control function. Within the output word width, this would allow use of an arbitrary volume taper as mentioned.

Generally speaking, the noise shaper represents the primary means employed to reduce the word width needed for digital to analog conversion. In an embodiment, a type of delta sigma modulator called an error feedback (distinct from output feedback) structure is employed. Advantageously, the error feedback structure is simpler to design, in comparison to the difficulties designing an output feedback structure.

Figure 5:
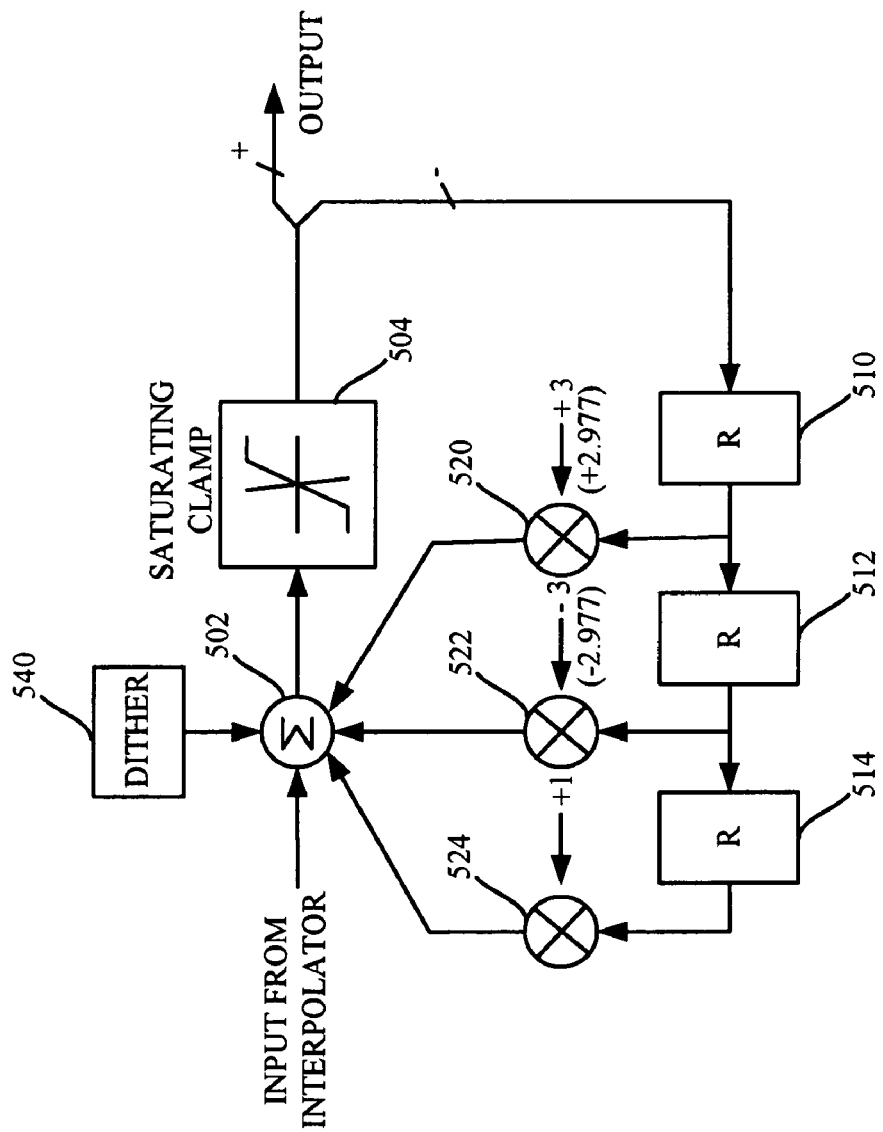
FIG. 5 shows, in accordance with an embodiment of the invention, an example noise shaper implementation, in accordance with an embodiment of the present invention.

FIG. 5 shows an example noise shaper implementation, in accordance with an embodiment of the present invention. In an example noise shaper implementation, the 21 bit result from the volume control (which in integrally implemented with the interpolator in an embodiment since the volume control circuit employs at least some circuitry of the interpolator) is applied to one port of an adder (502 in FIG. 5). The adder produces a 22 bit output. The 22 bit output is clamped (via saturating clamp 504 of FIG. 5) to assure that the sum does not wrap around; instead, it saturates. The 22 bit result is then split into two pieces, the four most significant bits, and the eighteen least significant bits. The 4 MSBs are the output from the noise shaper. The 18 LSBs are the error feedback.

The error feedback is applied to an FIR high pass filter, and the FIR high pass output is applied to the input adder described above. The high pass filter design starts with a differentiator with a transfer function $H(z)=(1-z^{-1})^3$. This filter has a gain that increases to a factor of 8 at the loop Nyquist frequency. This is equivalent to adding three additional bits to form an undistorted high pass output. By maintaining the input adder width as the same as the error feedback word width multiplied by the gain of the high pass response, the loop remains stable in as much as no saturation or wrap around phenomena occur.

As it stands, the differentiator works over a limited bandwidth, and then its monotonically increasing gain with respect to frequency causes the performance to degrade. To alleviate this, the zeros of the high pass response are shifted to form a wider stopband. With the third order response, the three zeros are manipulated so that one is left at DC and the others are moved to near the upper end of the audio band (about 18 kHz). This optimization produces a modulator noise transfer function which maintains the stopband gain at a lower level over a wider bandwidth, thereby alleviating the performance deterioration caused by the use of a differentiator transfer function.

For the third order noise shaper, the FIR kernel values for the error feedback are, for a differentiator response, {3, −3, 1}. The optimization procedure changes this to {2.977, −2.977, 1}. In FIG. 5, three registers 510, 512, and 514 and three multipliers 520, 522, and 524 implement the feedback loop. To further simplify an embodiment, shift and add operations are employed to implement these kernels. The expansion used has four terms, 2+1−1/32+1/128. This gives response negligibly different from the optimized response.

Finally, a dither signal (540) is added to the input to assure good performance, free of artifacts, when the signal input approaches zero. The dither is generated by well known techniques using maximal length sequences. In an embodiment, the dither is updated at the noise shaper rate, and uses an MLS (Maximal Length Sequence) of length $2^{14}-1$. Simulation showed no problems varying the length over a wide range. The dither can be applied in one of two places in the noise shaper loop. The first choice is to add the dither to the error feedback before it is applied to the FIR filter. This has the benefit of attenuating any noise components that could be in band. As a simplification, the dither is applied to the input adder, scaled so the dither represented a 6 bit 2's complement quantity added to the 21 bit input signal, the two words aligned on their LSB. This simplification saves an adder and produced no measurable difference in the results.

The 4-bit output of the noise shaper is transformed to a 1 bit output for digital to analog conversion by pulse width modulation. In an embodiment, the pulse width modulation takes the 5 MSBs from the noise shaper 22-bit output and adds +1 to round the 5 MSBs to a 4-bit result. This 4-bit result is then used to compute the width of the output pulse. In order to minimize distortion, the output pulse width is changed in a symmetric manner around the center of the PWM carrier period. This can be thought of as keeping the center of gravity of the waveform constant; if the PWM is 'populated' by simply counting in from the beginning or ending epoch of the carrier, the center of gravity moves with the modulation value, causing a distortion. Symmetric application of the modulation avoids this, but it does require increasing the granularity of the PWM by a factor of two.

Figure 6:
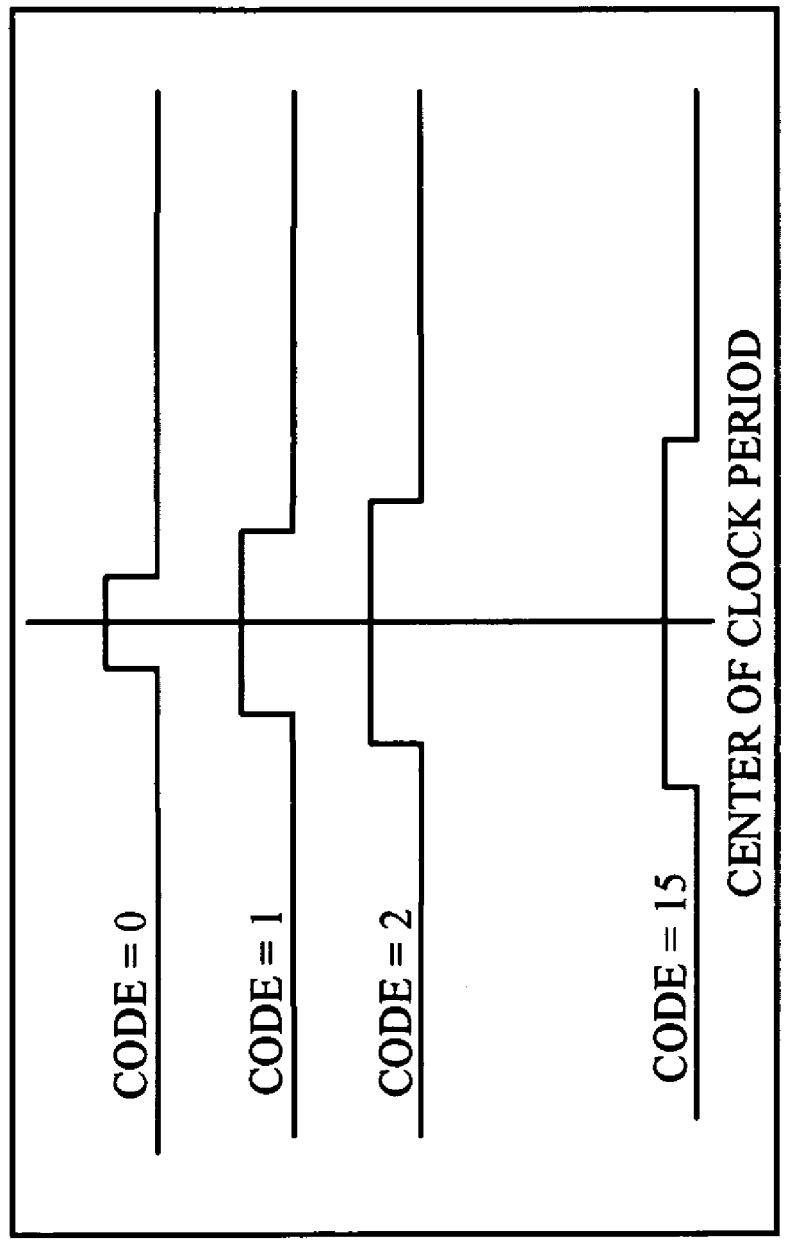
FIG. 6 shows, in accordance with an embodiment of the invention, an example output of the PWM block for various codes.

An example implementation uses the 4-bit input to access a codebook table to generate the actual PWM output. The codebook table returns a string of 32 sample values that are either zero or one. The output clock scans this vector, setting or clearing the output as desired. Techniques such as using a re-clocking register, which is known in the art, may be employed to assure that the output is free of glitches. FIG. 6 shows an example output of the PWM block for various codes.

The single bit output from the pulse width modulator is then converted into an analog signal. For successful conversion, it is desirable to have the output buffer show a negligible difference in output impedance as it switches from one state to the other.

Figure 7:
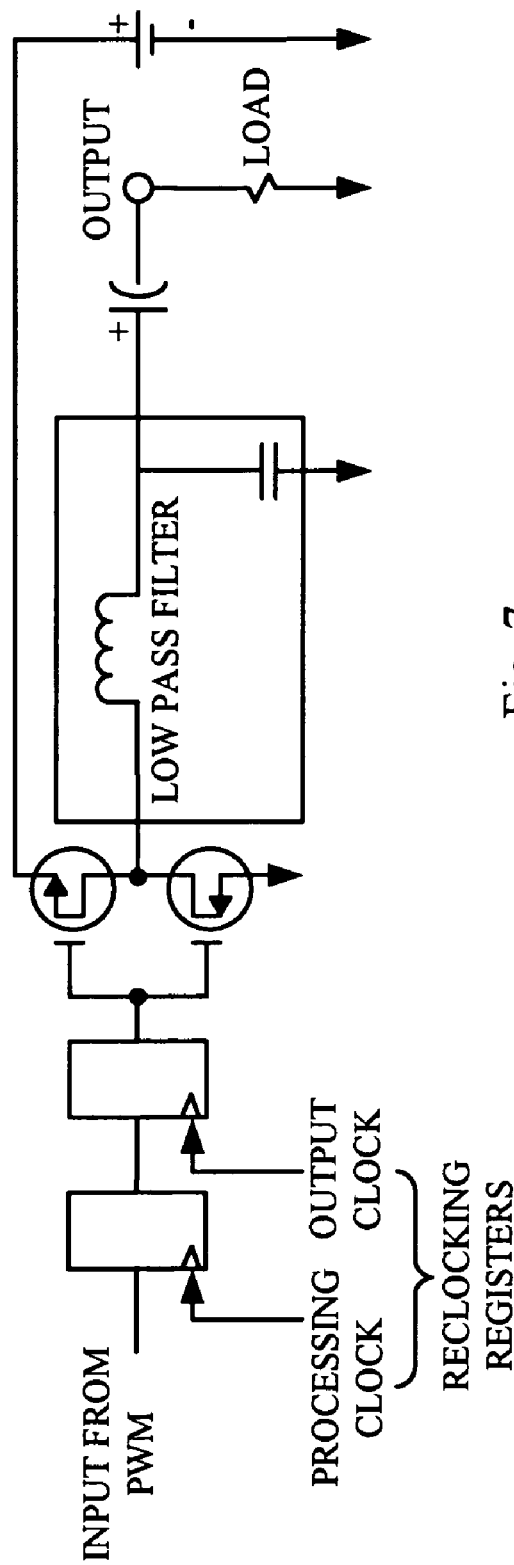
FIG. 7 shows, in accordance with an embodiment of the invention, an example of an analog reconstruction filter.

The buffer then drives an analog reconstruction filter. FIG. 7 shows an example of an analog reconstruction filter. This is a low pass filter with a cut off frequency between 40 and 70 kHz. The actual cut off frequency may vary according to implementations. Maintaining an octave between the filter cut off and the upper band edge pushes the more severe group delay distortion above the audio band, such that the response in the audio band is predominated by the response of the first stage of the interpolator cascade. The low pass filter is typically second order so that it will not result in excessive insertion loss. Out of band noise tends to be rapidly attenuated with such a filter, falling 40 dB at the noise shaper sampling rate.

Generally speaking, a typical embodiment of the DAC generates an output signal that swings between zero and some positive voltage. The transition generator addresses the problems with the transient response of the analog output network.

Typically, this 'unipolar' PWM will be applied to the analog low pass filter and then to a decoupling capacitor so that the actual analog output will be 'bipolar'. The decoupling capacitor has a voltage of V+/2 developed across it, which can be charged by application of the PWM output.

In an embodiment, the transition generator applies a raised cosine taper to a PWM applied to the output. This has the form 0.5[1+cos(arg)]. This function may be generated with simple hardware, two registers and two adders that implement a second order recursive section. This section is initialized so arg=−π, and the filter is incremented a fixed number of time steps, until, equivalently, arg=0. This generates a smooth raised cosine variation in the section output, which is then applied to the pulse width modulator, albeit with a much higher PWM clock to support the wider word widths needed, typically 11 bits.

Figure 8A:
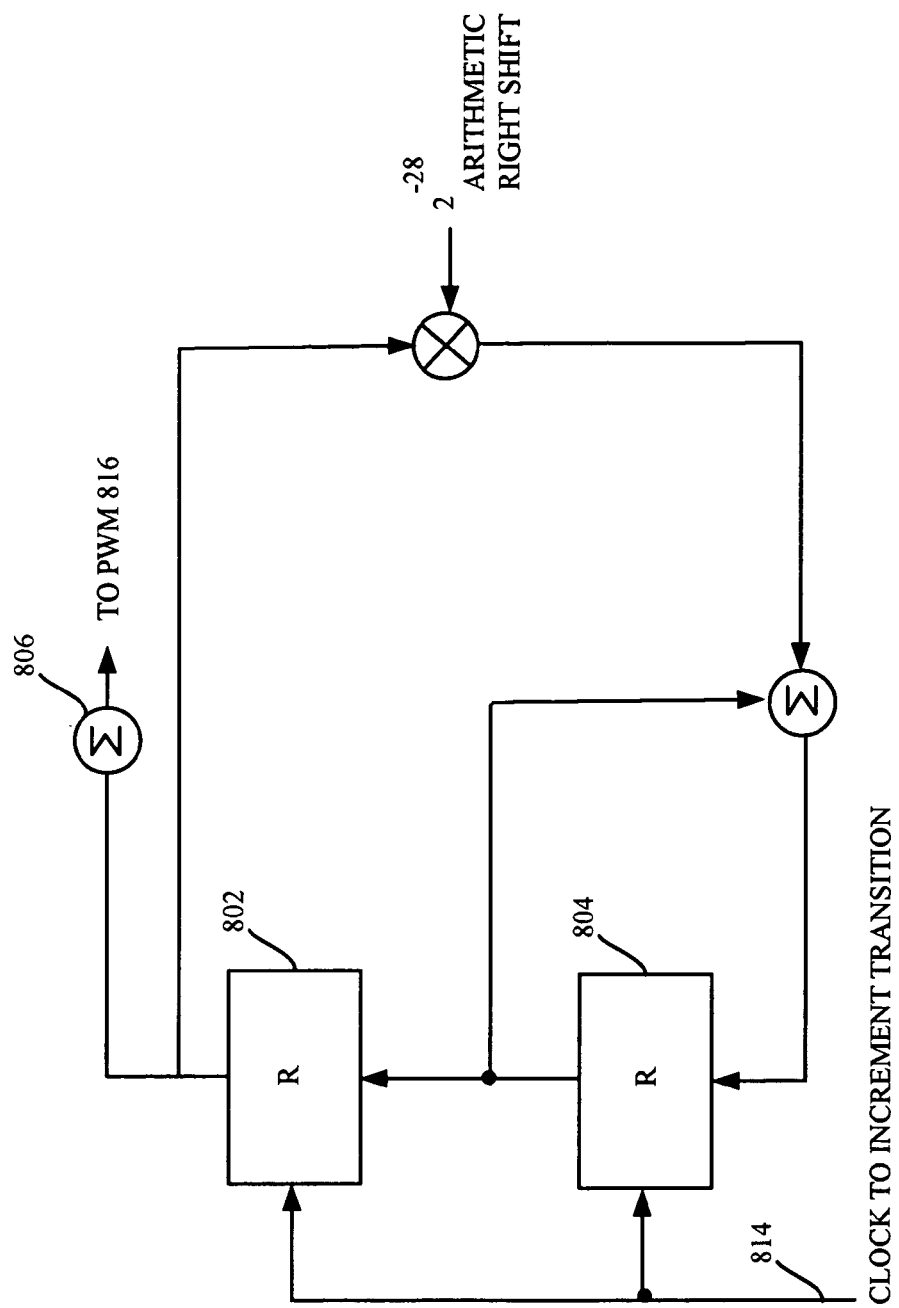
FIG. 8A shows an example implementation of a transition control block in accordance with an embodiment of the present invention.
Figure 8B:
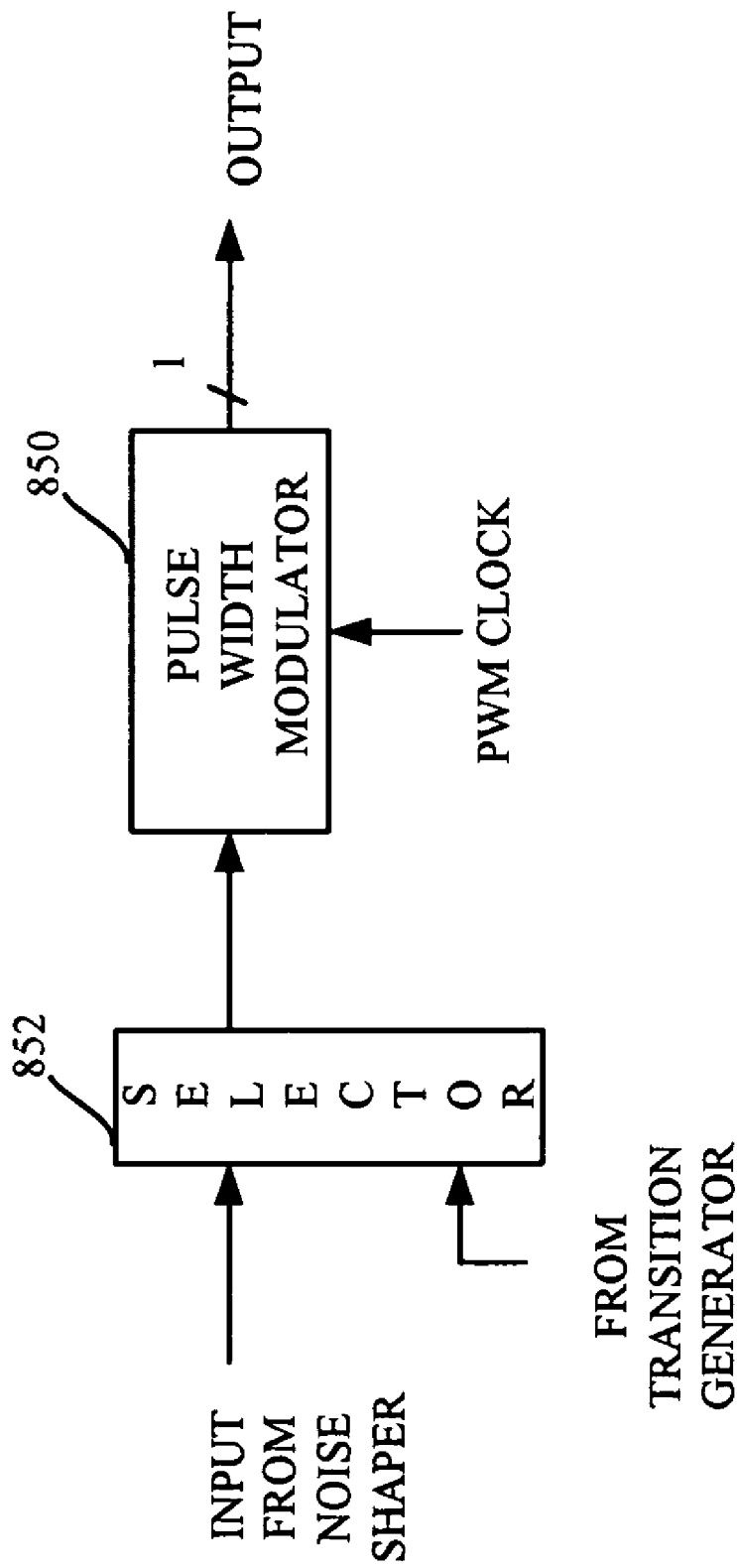
FIG. 8B shows, in accordance with an embodiment of the invention, a simplified PWM block having a PWM circuit and a selection circuit.

FIG. 8A shows an example implementation of a transition control block in accordance with an embodiment of the present invention. Transition control block 800 provides a raised cosine taper to the PWM block during start up or shut down situations. Raised cosine taper is chosen for its desirable spectral characteristics although other tapers may be employed. Transition control block 800 implements a second-order recursive network implemented by two registers 802 and 804, an adder 806, and an arithmetic right shift unit 808. The arithmetic shift unit shifts the word received at its input 28 bits to the right, resulting in a very small value being input into register 804. Registers 802 and 804 are set to the initial conditions. Clock 814 increments the recursive section, providing output 816 to the PWM block to be employed during start up. Running the recursive section backward results in an output 816 that can be provided to the PWM block during the shut down operation. FIG. 8B shows, in accordance with an embodiment of the invention, a simplified PWM block having a PWM circuit 850 and a selection circuit 852. During normal operation, PWM circuit 850 receives data from the output of the noise shaper. During startup or shutdown condition, PWM circuit 850 receives data from the output of the transition generator block.

Figure 9:
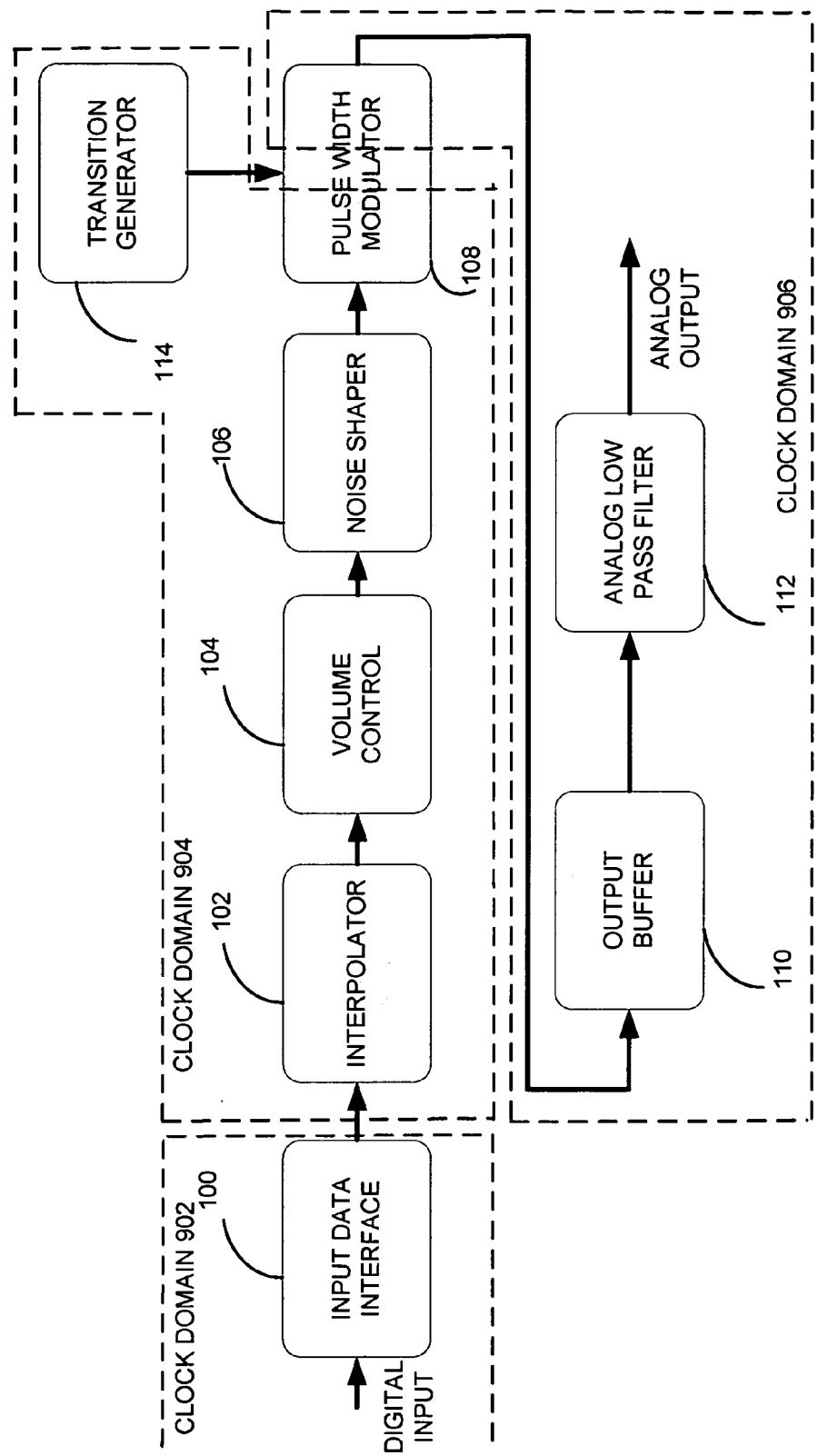
FIG. 9 shows an implementation wherein the DAC is divided into three clock domains, each of which may operate using a different clock.

FIG. 9 shows an implementation wherein the DAC is divided into three clock domains, each of which may operate using a different clock. Clock domains 902 comprises the input data interface block. Clock domain 904 comprises the interpolator block, the volume control block, the noise shaper block, the transition generator block, and part of the pulse width modulator block. Clock domain 906 comprises a part of the pulse width modulator block and a part of the output buffer block. These clock domains are linked by FIFOs (between the clock domains and not shown), which are provided with semaphores. In the example of FIG. 9, circuitry in an upstream clock domain (e.g., clock domain 904) may process data at high speed for a short period of time, stores the result in a FIFO, and then goes into an idle mode to save power. As the result data in the FIFO is consumed by the downstream clock domain (e.g., clock domain 906) to some predefined level, the semaphore is set to wake up the upstream clock domain circuitry to allow the upstream clock domain to begin processing data again. In this manner, advantage is taken of the higher speed offered by modern circuitry while power consumption is optimized since circuitry in an upstream clock domain only gets woken up (such as circuitry in clock domain 904, which tends to consume the most power when active) and asked to process data on an as-needed basis.

As can be seen, embodiments of the invention implement a self-contained DAC that is especially suitable for use as an IP core, particularly for SOC (System on Chip) implementation. In an embodiment, after the volume control word is set, input data may be received and 1-bit output per channel is provided without requiring further adjustment or input. The registers of the transition generator may be pre-loaded with values or, if desired, the registers of the transition generator may be provided with custom values to customize the transition generator block for a particular application. Techniques are applied to employ certain circuits (such as arithmetic element 302) to perform multiple functions in the DAC, thereby resulting in space saving. Techniques are also applied to employ fewer circuits per functional block to achieve further space saving. By employing multiple clock domains and turning on selective circuits on an as-needed basis, power saving is also realized.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A digital-to-analog converter (DAC) circuit for converting digital input data to analog data, comprising:
    an input host interface circuit configured to receive the digital input data; and
    an interpolator circuit configured to interpolate at least a portion of the digital input data received by the input host interface circuit and to generate interpolated data, wherein the interpolator circuit is implemented with multiple interpolator stages sharing an arithmetic unit for computing the interpolated data, the multiple interpolator stages representing at least one of a cascade of four finite impulse response half-band filters and a cascade of digital filters and zero order holds, the digital filters having selectable kernel lengths and word widths.

2. The DAC circuit of claim 1 wherein the digital filters are finite impulse response filters.

3. The DAC circuit of claim 1 wherein the digital filters are infinite impulse response filters.

4. The DAC circuit of claim 1 wherein the digital filters are Lagrangian interpolation filters.

5. The DAC circuit of claim 1 wherein the digital filters represent cascaded integrator-comb filters.

6. The DAC circuit of claim 1 wherein the multiple interpolator stages are implemented by a plurality of microprograms configured to be executed by the arithmetic unit.

7. The DAC circuit of claim 6 further comprising a program counter circuit, wherein each of the plurality of microprograms is associated with a control field value, a microprogram of the plurality of microprograms is executed by the arithmetic unit when its associated control field value matches a program counter value provided by the program counter circuit.

8. The DAC circuit of claim 1 further comprising:
a volume control circuit configured to generate volume-weighted data from the interpolated data; and
a noise shaper circuit for reducing a word width of the volume-weighted data to generate reduced-width noise shaper output.

9. The DAC circuit of claim 8 wherein the volume control circuit is implemented by explicit hardware multiplication using a multiplier and volume control data provided by a host.

10. The DAC circuit of claim 8 wherein the volume control circuit is implemented by explicit hardware multiplication using a multiplier and volume control data provided by lookup table output from a lookup table, the lookup table receiving a volume control word and providing the volume control data to the multiplier.

11. The DAC circuit of claim 10 wherein the digital input data is received as two separate data streams comprising a first data stream for left channel samples and a second data stream for right channel samples.

12. The DAC circuit of claim 10 wherein the digital input data is received as single data stream wherein left channel sample data and right channel sample data are processed sequentially in different clock cycles in the interpolator circuit.

13. The DAC circuit of claim 8 wherein the volume control circuit is implemented as the last stage of the interpolator circuit.

14. The DAC circuit of claim 13 wherein interpolator coefficients of the last stage are integers {x,y,z}, the interpolator coefficients are provided by a structure that is one of a lookup table and a plurality of registers such that for a given volume setting v, the structure results in values {xv, yv, zv}.

15. A digital-to-analog converter (DAC) circuit for converting digital input data to analog data, comprising:
an input host interface circuit configured to receive the digital input data;
an interpolator circuit configured to interpolate at least a portion of the digital input data that is received by the input host interface circuit and to generate interpolated data;
a volume control circuit configured to generate volume-weighted data from the interpolated data; and
a noise shaper circuit for reducing the word width of the volume-weighted data to generate reduced-width shaper output,
wherein the volume control circuit and the interpolator circuit share an arithmetic element to generate the interpolated data and to generate the volume weighted data.

16. The DAC circuit of claim 15 wherein the volume control circuit is implemented by explicit hardware multiplication using a multiplier and volume control data provided by a host.

17. The DAC circuit of claim 15 wherein the volume control circuit is implemented by explicit hardware multiplication using a multiplier and volume control data provided by lookup table output from a lookup table, the lookup table receiving a volume control word and providing the volume control data to the multiplier.

18. The DAC circuit of claim 15 wherein the volume control circuit is implemented as the last stage of the interpolator circuit.

19. The DAC circuit of claim 18 wherein interpolator coefficients of the last stage are integers {x,y,z}, the interpolator coefficients are provided by a structure that is one of a lookup table and a plurality of registers such that for a given volume setting v, the structure results in values {xv, yv, zv}.

20. A digital-to-analog converter (DAC) circuit for converting digital input data to analog data, comprising:
an input host interface circuit configured to receive the digital input data;
an interpolator circuit;
a volume control circuit coupled to the interpolator circuit, the interpolator circuit and the volume control circuit being configured to receive the digital input data and to output volume-weighted and interpolated data;
a noise shaper circuit coupled to receive the volume-weighted and interpolated data to generate reduced-width shaper output;
a transition generator circuit configured to generate a transition signal; and
a pulse width modulator circuit configured to receive the reduced-width shaper output and to produce a first pulse code modulation signal from the reduced width shaper output when the DAC is operating in a first state, the pulse width modulator circuit configured to receive the transition signal to produce a second pulse code modulation signal from the transition signal when the DAC is operating in a second state, the second state being characteristic of at least one of a power-up condition and a power-down condition, the first state being characteristic of operating conditions other than the at least one of the power-up condition and the power-down condition.

21. The DAC circuit of claim 20 wherein the transition signal is configured to produce a smooth transition in the second pulse code modulation signal during the at least one of the power-up condition and the power-down condition.

22. The DAC circuit of claim 20 wherein the transition signal comprises a plurality of pulse code modulation values, the pulse code modulation values being generated by dedicated arithmetic hardware.

23. The DAC circuit of claim 20 wherein the transition signal comprises a plurality of pulse code modulation values, the pulse code modulation values being generated by one of a linear counter and an accumulator.

24. The DAC circuit of claim 20 wherein the transition signal comprises a plurality of pulse code modulation values, the pulse code modulation values being generated by dedicated arithmetic hardware that is configured to produce a solution for a second order difference equation.

25. The DAC circuit of claim 20 wherein the transition signal comprises a plurality of pulse code modulation values, the pulse code modulation values being generated by dedicated arithmetic hardware that is configured to produce values in accordance with a function of $0.5[1+\cos(\arg)]$.

26. A digital-to-analog converter (DAC) circuit for converting digital input data to analog data, comprising:
an input host interface circuit configured to receive the digital input data;
an interpolator circuit;
a volume control circuit coupled to the interpolator circuit, the interpolator circuit and the volume control circuit being configured to receive the digital input data from the input host interface circuit and to output volume-weighted and interpolated data;

a noise shaper circuit coupled to receive the volume-weighted and interpolated data to generate reduced-width shaper output;

a pulse width modulator circuit configured to receive the reduced-width shaper output and to produce a first pulse code modulation signal from the reduced width shaper output; and an analog output circuit including an output buffer and a low-pass filter for receiving the first pulse code modulation signal and outputting the analog data, wherein the input host interface circuit employs a first clock associated with a first clock domain, the interpolator circuit, the volume control circuit, and the noise shaper circuit, and at least a portion of the pulse width modulation circuit employ a second clock associated with a second clock domain, the second clock being asynchronous relative to the first clock.

27. The DAC circuit of claim 26 further comprising a transition generator circuit configured to generate a transition signal for use by the pulse width modulator circuit to generate a second pulse code modulation signal during at least one of a power-up condition and a power-down condition, the transition generator circuit employs the second clock associated with the second clock domain.

28. The DAC circuit of claim 26 wherein the analog output circuit employs a third clock associated with a third clock domain, the third clock being asynchronous with respect to the second clock and the first clock.

29. The DAC circuit of claim 28 wherein the second clock domain and the third clock domain are bridged by a FIFO circuit, circuitries in the second clock domain is activated from an idle state to produce the first pulse code modulation signal from an idle state when data output by the circuitries in the second clock domain is required by circuitries in the third clock domain.

30. The DAC circuit of claim 26 wherein the second clock domain and the first clock domain are bridged by a FIFO circuit, circuitries in the first clock domain is activated from an idle state to receive the digital input data when the digital input data is required by circuitries in the second clock domain.

31. The DAC circuit of claim 30 wherein the input host interface circuit is coupled to receive data from a host using a FIFO such that data transmitted from the host to the input host interface circuit is free of gaps due to non-uniformly spaced pulse code modulation samples.

* * * * *